United States Patent
Ballantine et al.

(10) Patent No.: US 6,417,070 B1
(45) Date of Patent: Jul. 9, 2002

(54) METHOD FOR FORMING A LINER IN A TRENCH

(75) Inventors: Arne W. Ballantine, Cold Spring, NY (US); Jeffrey S. Brown, Middlesex, VT (US); Jeffrey D. Gilbert, South Burlington, VT (US); James J. Quinlivan, Essex Junction, VT (US); James A. Slinkman, Montpelier, VT (US); Anthony C. Speranza, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/735,988

(22) Filed: Dec. 13, 2000

(51) Int. Cl.⁷ .......................... H01L 21/76; H01L 21/31
(52) U.S. Cl. ...................... 438/424; 438/435; 438/437; 438/770
(58) Field of Search .................... 438/424, 283, 438/626, 586, 787, 770, 773, 435, 437, 296; 257/486, 740, 751, 767

(56) References Cited

U.S. PATENT DOCUMENTS

| | | | | |
|---|---|---|---|---|
| 4,814,291 A | * | 3/1989 | Kim et al. .................. 437/101 |
| 4,989,055 A | * | 1/1991 | Redwine ..................... 357/23.3 |
| 5,244,821 A | | 9/1993 | Ham et al. ..................... 437/31 |
| 5,561,088 A | | 10/1996 | Sameshima .................. 437/247 |
| 5,763,315 A | * | 6/1998 | Benedict et al. ............. 438/424 |
| 5,780,346 A | | 7/1998 | Arghavani et al. .......... 438/296 |
| 5,854,114 A | | 12/1998 | Li et al. ...................... 438/296 |
| 5,891,809 A | * | 4/1999 | Chau et al. .................. 438/770 |
| 5,920,787 A | | 7/1999 | Haskell et al. .............. 438/425 |
| 5,935,650 A | | 8/1999 | Lerch et al. ............. 427/255.4 |
| 5,960,299 A | | 9/1999 | Yew et al. ................... 438/424 |
| 6,046,487 A | * | 4/2000 | Benedict et al. ............. 257/510 |
| 6,066,576 A | * | 5/2000 | Thakur et al. ............... 438/770 |
| 6,180,492 B1 | * | 1/2001 | Shih et al. ................... 438/435 |
| 6,197,628 B1 | * | 3/2001 | Vaartstra et al. ............ 438/238 |
| 6,204,172 B1 | * | 3/2001 | Marsh ......................... 438/653 |
| 6,265,282 B1 | * | 7/2001 | Lane et al. .................. 438/424 |

* cited by examiner

Primary Examiner—Michael S. Lebentritt
(74) Attorney, Agent, or Firm—Connolly Bove Lodge & Hutz; William D. Sabo

(57) ABSTRACT

A structure comprising a trench having a liner with rounded corners in the top and bottom of the trench is obtained by rapid thermal oxidation.

19 Claims, 6 Drawing Sheets

METHOD FOR FORMING A LINER IN A TRENCH

BACKGROUND

Isolation structures are formed in an integrated circuit for the purpose of preventing carriers from penetrating through the substrate to neighboring components. For example, in standard CMOS transistor processing, an isolation trench is etched into a semiconductor substrate and a liner is formed in the trench by oxidation. The liner oxidation is carried out for a number of reasons including rounding of the trench corner to provide better breakdown characteristics, formation of a high quality dielectric layer, creating a trench structure which is easy to fill, passivation of damage from the RIE (reactive ion etching), minimization of effects of contamination and improvement of the electrical characteristics of the trench isolation.

Historically, standard batch furnace processing has been used to carry out the liner oxidation. Such processing typically provides some rounding of the corners of the liner as well as providing a relatively high quality oxide on the sidewalls of the trench. However, the oxide that is grown by standard batch furnace processing is not especially conformal. In particular, the oxide typically forms in a bread loaf like configuration. This in turn renders the trench that remains after growing of the sidewalls somewhat challenging to fill by currently available deposition processing. Furthermore, although some rounding of the corners does occur using standard batch furnace processing, the rounding is not as much as desired for satisfying the needs of current state of the art devices.

SUMMARY OF INVENTION

The present invention provides a method for forming a liner in a trench that exhibits enhanced rounded corners in the top and bottom of the trench as well as exhibiting a conformal structure. In particular, the method of the present invention comprises forming a liner in a trench wherein the liner has rounded corners in the top and bottom of the trench and which comprises forming the liner by rapid thermal oxidation.

In addition, the present invention relates to lined trenches formed by the above-disclosed method. The liners achieved by the present invention exhibit uniform growth along the sidewalls of the trench and exhibit reduced stress.

Still other objects and advantages of the present invention will become readily apparent by those skilled in the art from the following detailed description, wherein it is shown and described preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

DETAILED DESCRIPTION OF INVENTION

The method of the present invention relates to forming a liner in a trench. By way of example to illustrate the method of the present invention, reference will be made to the figures and to forming a STI (shallow trench isolation) structure in a semiconductor substrate. However, it being understood that the present invention is applicable to forming liners in trenches in general and is not restricted to STI.

Figure 5:
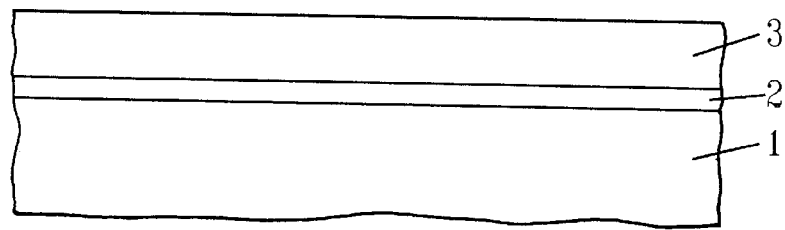
FIGS. 5–13 are schematic diagrams of a structure according to the present invention during various fabrication stages.

In particular, reference to FIG. 5 illustrates a structure comprising a semiconductor substrate 1 such as silicon, a first pad insulator 2 such as silicon oxide having a typical thickness of about 100 Å and a second pad insulator 3 such as silicon nitride having a typical thickness of about 800 Å.

Figure 6:
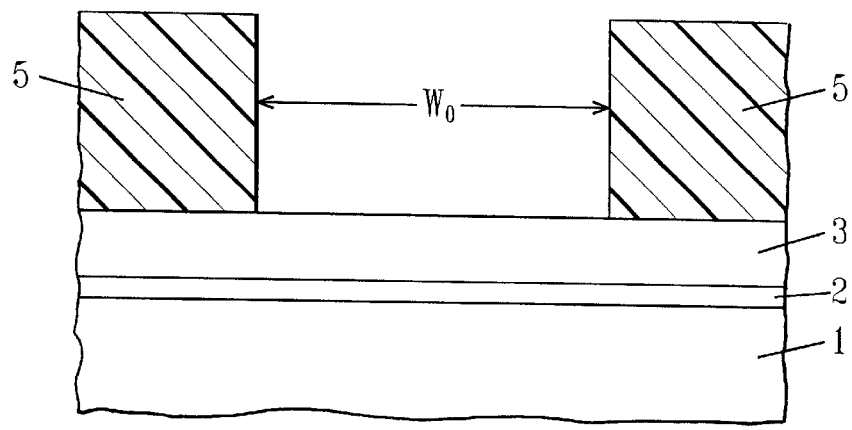

In order to form a trench, a typical method is to provide a mask layer 5 (see FIG. 6) over the substrate followed by removing selected portions of the mask layer. An example of a nominal width Wo of the pattern formed in the mask layer 5 is about 0.3

Figure 7:
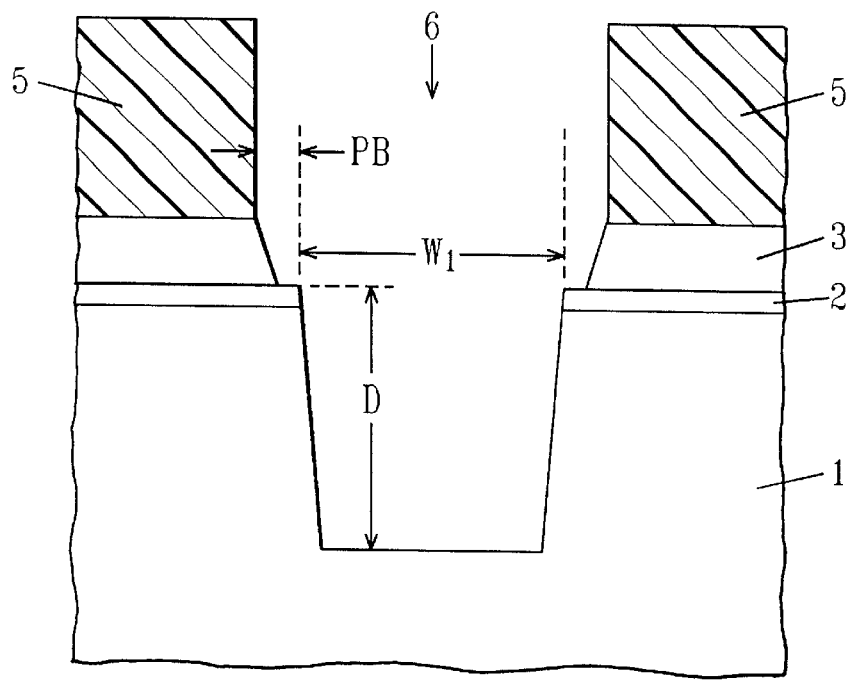

FIG. 7 illustrates removing the exposed portions of the pad insulator 3, pad insulator 2 and the underlying substrate 1 to form the trench 6. In the case of shallow trenches, the maximum depth is typically about 0.5 microns into the substrate 1. The etching also results in laterally erosion (PB) of the layer 3 which is typically about 30 angstroms to about 300 angstroms and preferably about 75 angstroms to about 200 angstroms, a typical preferred example being about 200 angstroms. Too small a radius causes dopant depletion or pileup (depending on the adjacent channel tailor and well dopant species) during oxidation and the associated CMOS FET device threshold voltage, Vt, shifts due to the degree of sharpness of the top isolation trench corner.

After the trench is formed, the liner 8 is then created according to the method of the present invention.

Figure 8:
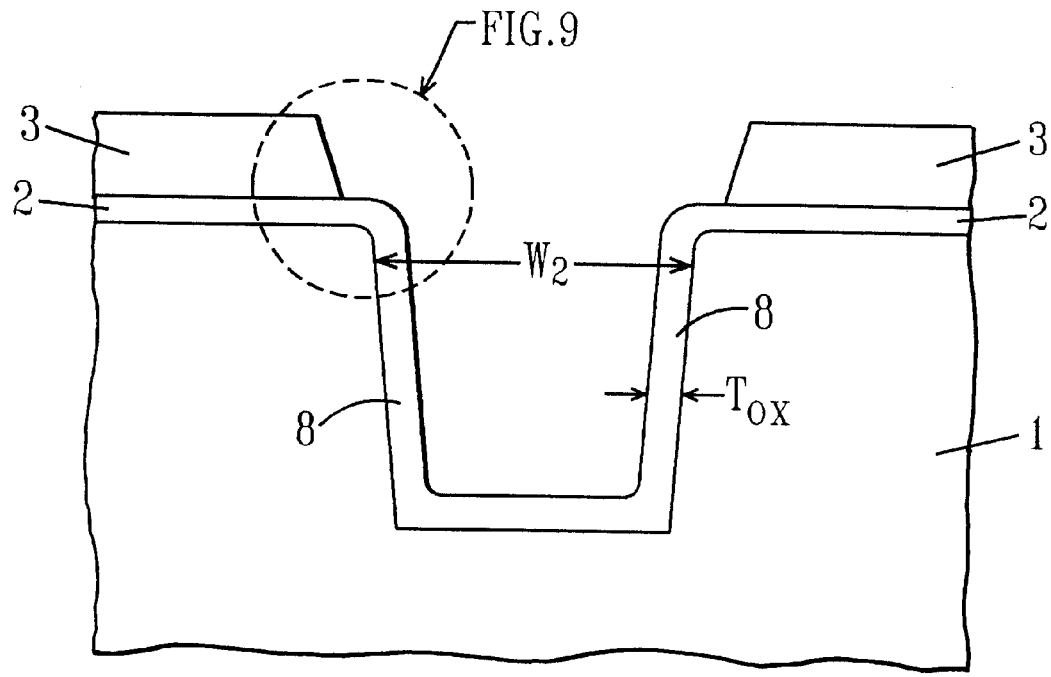

In particular, the structure is subjected to rapid thermal oxidation. See FIG. 8. The rapid thermal oxidation is preferably carried out at temperatures of about 900 to about 1300° C. and more preferably about 1050 to about 1200° C. The process is typically carried out in less than 3 minutes, more typically about 1 second to less than 3 minutes, and preferably about 20 seconds to about 1 minute depending upon the desired thickness of the liner and the particular temperature employed. It being understood that the time is inversely related to the temperature. In other words, the higher the temperature, the shorter the time for a given thickness.

The rapid thermal oxidation is preferably a wet rapid thermal oxidation process carried out in the presence of steam. The amount of steam typically present is about 0.5% to about 50% and preferably about 2% to about 33%.

The liner typically has a thickness of up to about 500 angstroms, more typically about 40 angstroms to about 500 angstroms and preferably about 225 angstroms to about 450 angstroms.

Figure 9:
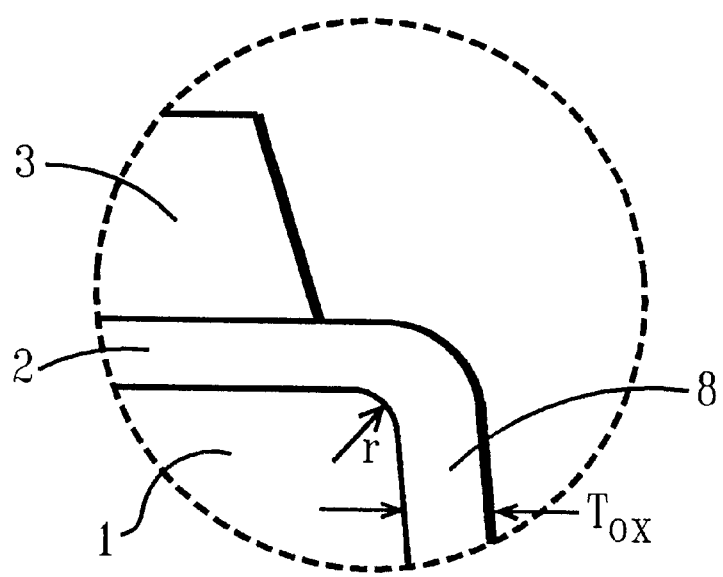

The corners of the liner typically exhibit a radius r of curvature (see FIG. 9) of about 30 angstroms to about 300 angstroms and preferably about 75 angstroms to about 150 angstoms.

The process of the present invention provides for a relatively conformal layer along with uniform growth along the sidewalls of the trench.

The wet processing is preferred since it provides for enhanced throughput relative to employing a dry rapid thermal oxidation as well as providing for more consistent and reproducibility of zero Vt devices. Wet rapid thermal oxidation is preferred since in order to perform corner rounding; whereas, oxides formed by dry rapid thermal oxidation oxides must be relatively thicker than those formed by wet rapid thermal oxidation in order to achieve the equivalent corner rounding. In order to grow a thick oxide with dry rapid thermal oxidation, the wafer processing time becomes relatively long, as much as 3 or 4 minutes, which is disadvantageous from a cost of ownership perspective. Moreover, the dry RTO process does not provide the level of enhanced corner rounding achievable by the wet rapid thermal process. Also, the dielectric formed by dry RTO processing is of somewhat lesser quality as the standard furnace oxide which uses a dry-wet-dry process typically. Employing a dry RTO process has been observed to create zero Vt device structures which were severely degraded due to elevated corner leakage.

The rapid thermal processing according to the present invention can be carried out in any suitable reactor such as an AMAT Centura RTP Tool or an AG8108RTP Tool.

Figure 10:
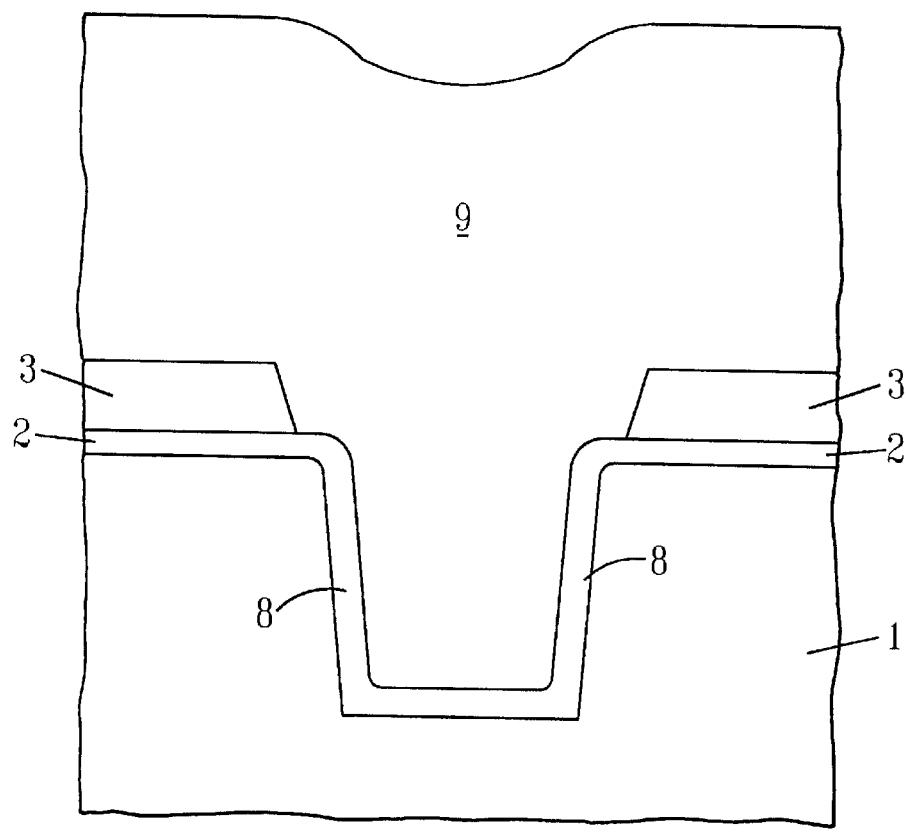

After formation of the liner, the trench can then be filled with an insulator. The trenches can be filled with an insulating material 9 such as silicon dioxide by employing such techniques as chemical vapor deposition (CVD), plasma enhanced chemical vapor deposition and TEOS (tetraethylorthosilicate). See FIG. 10. The filling of the trenches can be carried out by any of the techniques known in the art and details thereof need not be described herein.

Figure 11:
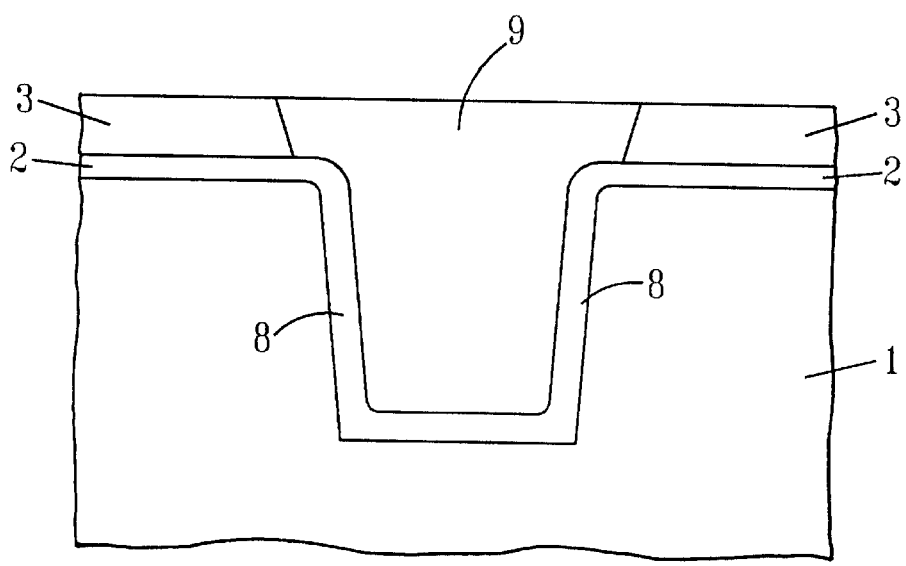

As illustrated in FIG. 11, the structure can be planarized by chemical-mechanical polishing of the overlaying insulating material 9 stopping on the pad insulator layer 3.

Figure 12:
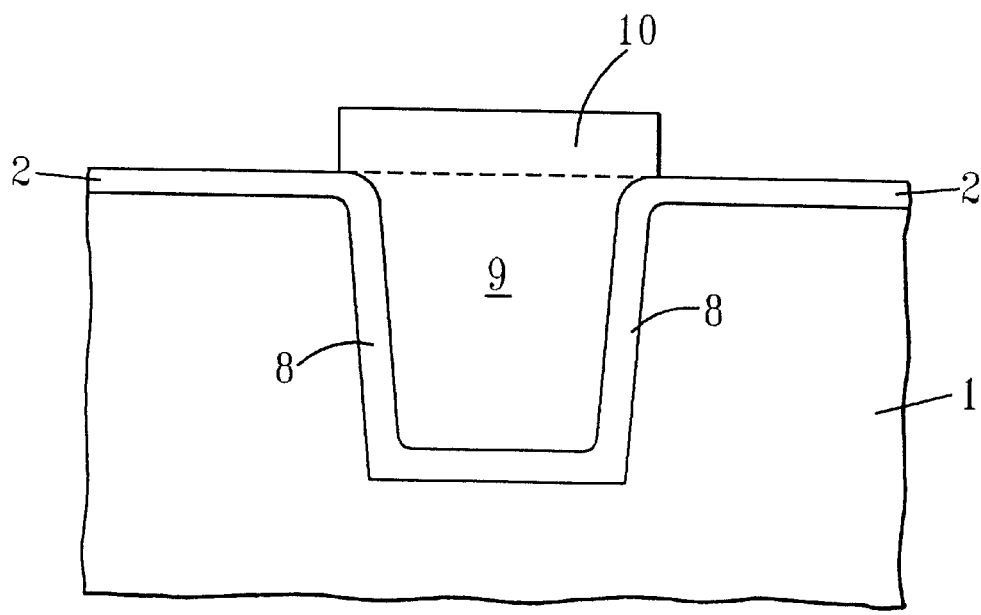

The pad insulator layer 3 is removed such as by etching thereby forming a step 10 of insulation layer 9. In the case of silicon nitride as the layer 3, such can be removed by etching in hydrofluoric acid (HF). See FIG. 12.

Figure 13:
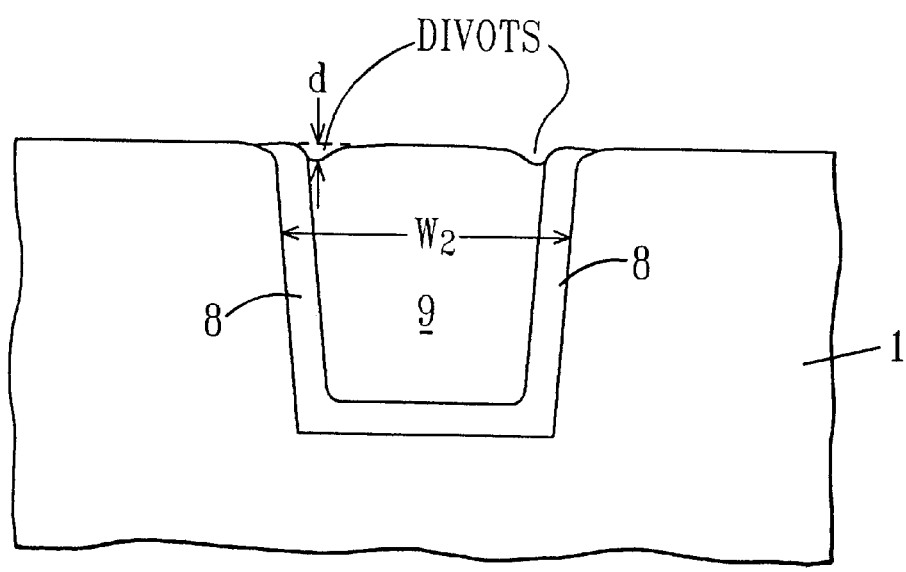

Next the pad insulator layer 2 and step 10 can be removed by etching thereby forming minimized divot depth d and maintaining the width $W_2$. See FIG. 13. Typically the depth d is no greater than about 300 angstroms and preferably about 100 angstroms to about 200 angstroms.

The etching in the case of insulator layer 2 being silicon dioxide and step 10 being TEOS can be carried out by etching in hydrofluoric acid (HF).

The following non-limiting examples are presented to further illustrate the present invention.

EXAMPLE 1

Figure 1:
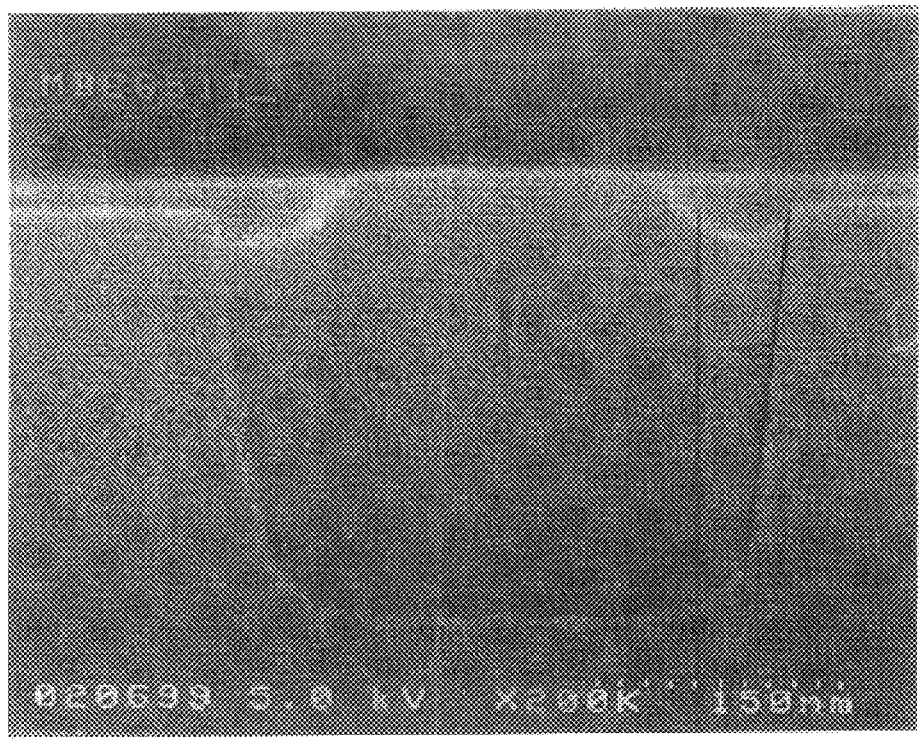
FIGS. 1–4 are SEMs of lined trenches obtained by the method of the present invention.

A CMOS structure is introduced into an AMAT Centura RTP reactor wherein steam is generated in situ by flowing in $H_2$ and $O_2$ at a pressure of about 10 Torr. The reactor is maintained at a steady state temperature of about 1100° C. for about 110 seconds thereby providing a liner oxide thickness of about 225 angstroms. The liner exhibits improved corner rounding, good zero Vt device performance and enhanced throughput. The test results are illustrated in Table 1 below. The bench $I_{vs}$ (current drain to source) vs. $V_{gs}$ (voltage gate to source) shows that the parasitic corner device is entirely eliminated. Table 1 below illustrates the parametric data obtained. A SEM of the structure is shown in FIG. 1.

In Table 1, "SCE" stands for Short Channel Effect and refers to the difference in FET threshold voltage, Vt, between an FET of nominal channel length and one of minimum channel length. It is desirable to minimize the difference, i.e. to have a smaller value of "SCE". "Rollup" refers to the difference in threshold voltage between a device with a very long channel length (typically about 10 im ), to that of a device with a nominal channel length. Typically the threshold voltage "rolls up" as the length becomes shorter. Again, it is desirable to minimize the difference. Finally, $Ä^2Vt$ refers to the difference of threshold voltage as determined at two distinct, well-defined current values in the FET subthreshold region expressed as a ratio of the difference relative to the threshold determined at the higher current value. The absolute value of $Ä^2Vt$ is desired to be less than 0.05 (i.e. 5% ), the smaller the better.

EXAMPLE 2

Figure 2:
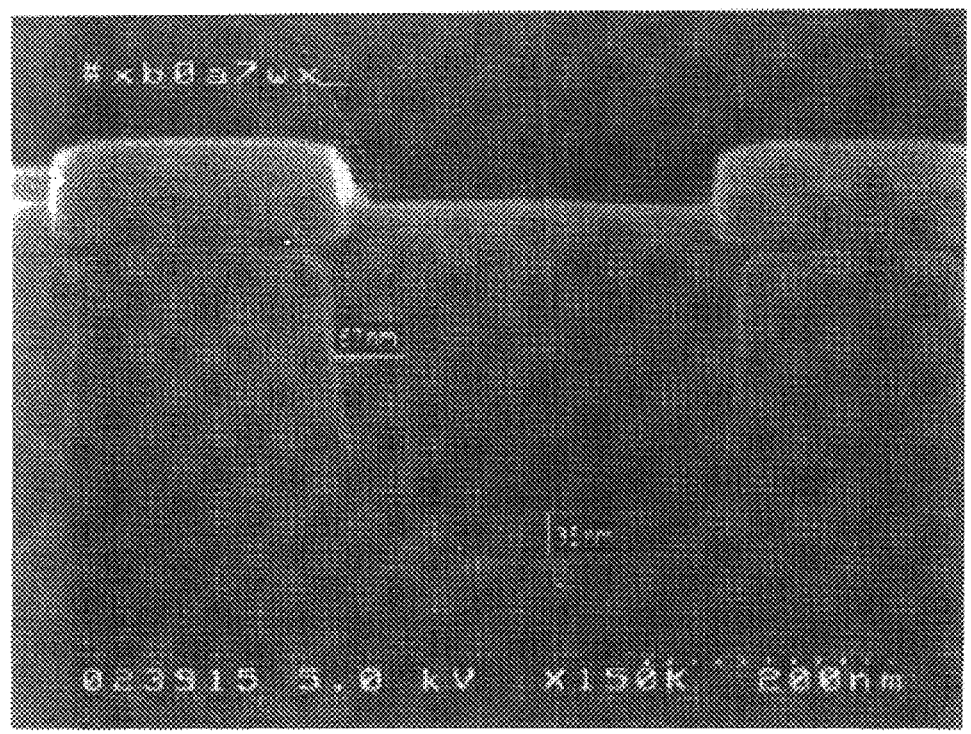

A CMOS structure is introduced into an AMAT Centura RTP reactor with in situ steam generation as in Example 1. The structure is subjected to a temperature of about 1150° C. for about 260 seconds to provide a liner oxide thickness of about 450 angstroms. The trenches are then filled with TEOS followed by a post isolation trench chemical mechanical polishing. A SEM of the structure is shown in FIG. 2. The results demonstrate uniform oxide growth along the trench sidewalls, improved corner rounding (a smooth radius instead of a bevel) along with thermal oxide "bird's beak" which retard trench isolation divot formation. The process also results in good zero Vt device formation, conformal oxidation growth (no pinching-off of oxide thickness in the trench corners), enhanced throughput, reduced film stress. In addition, because of the reduction of size and topography of the shallow trench divot, the changes of any residual polysilicon in a divot are reduced. In addition, the ability for reoxidation of the pad nitride at the trench edge results in reduced divot formation.

EXAMPLE 3

Figure 3:
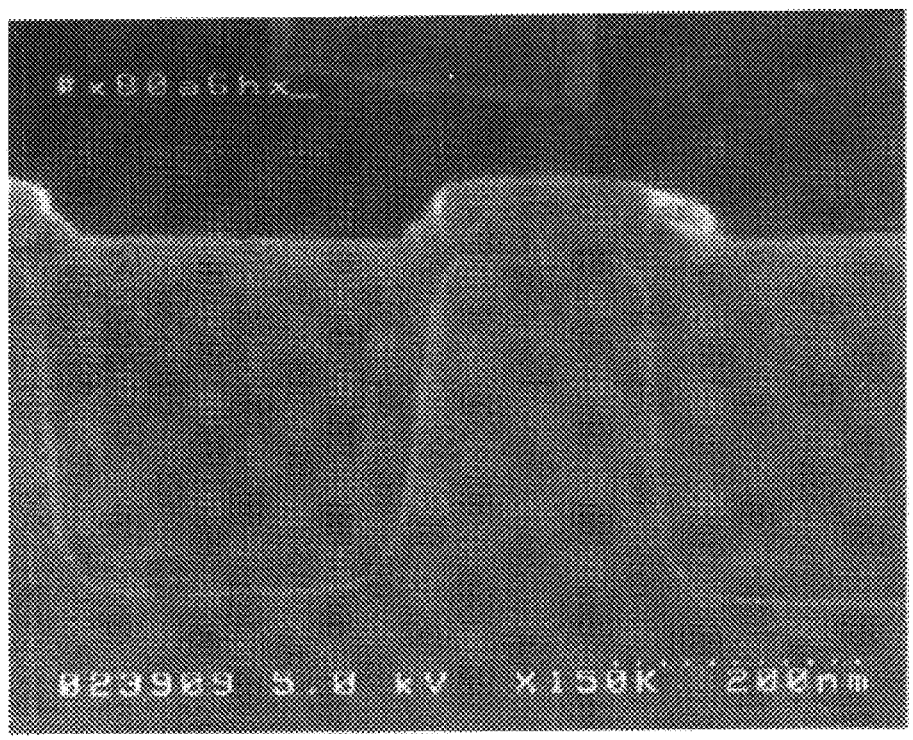

Example 2 is repeated except that the device is subjected to a post polysilicon gate conductor etch instead of the chemical mechanical polishing. The results are similar to those in Example 2 and are illustrated in FIG. 3.

EXAMPLE 4

Figure 4:
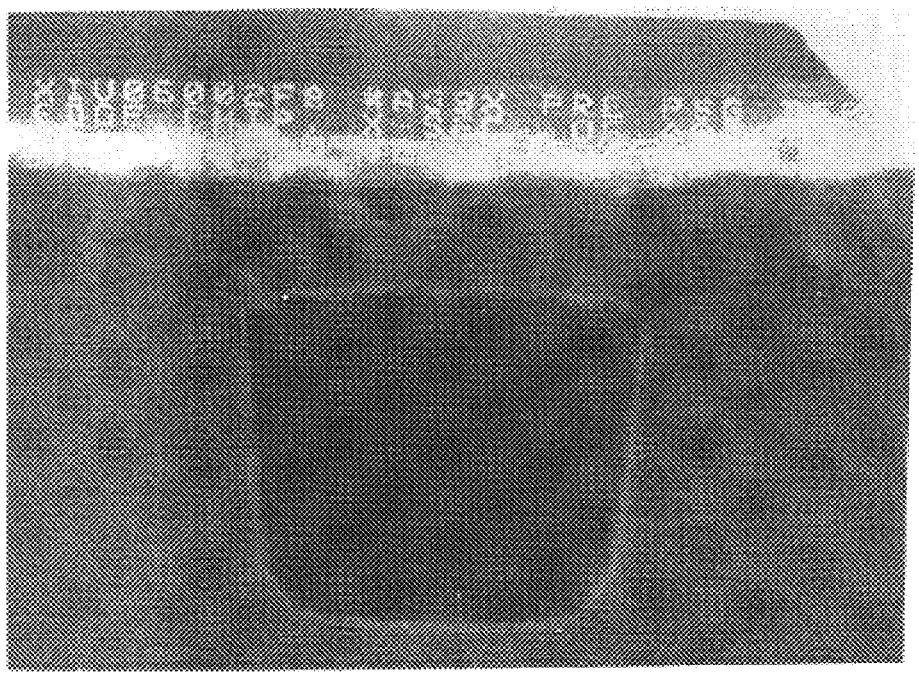

Example 3 is repeated except that the rapid thermal oxidation is carried out for about 120 seconds at about 1150° C. to provide a liner layer having a thickness of about 300 angstroms. The results obtained are illustrated in FIG. 4.

TABLE

|  | Ioff/um/nA | SCE | Rollup | $Ä^2Vt$ |
|---|---|---|---|---|
| Example 4 200 PB + 1150 C 300 A WET RTO | 0.6 | 200 | 197 | +0.01 |
| Example 1 PB 1100 C 225 A WET RTO | 1 | 260 | 209 | −0.03 |

Ioff refers to current when the gate is off.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method for forming a liner in a trench wherein the liner has rounded corners in the top and bottom of the trench, which process comprises forming the liner by wet rapid thermal oxidation.

2. The method of claim 1 wherein the temperature of the rapid thermal oxidation is about 900° C. to about 1300° C.

3. The method of claim 1 wherein the rapid thermal oxidation is carried out at a temperature of about 1050° C. to about 1200° C.

4. The method of claim 1 wherein the liner has a thickness of up to about 500 angstroms.

5. The method of claim 1 wherein the liner has a thickness of about 40 angstroms to about 500 angstroms.

6. The method of claim 1 wherein the liner has a thickness of about 225 to about 450 angstroms.

7. The method of claim 1 wherein the rapid thermal oxidation is carried out for less than 3 minutes.

8. The method of claim 1 wherein the rapid thermal oxidation is carried out for about 1 second to about 3 minutes.

9. The method of claim 1 wherein the rapid thermal oxidation is carried out for about 20 seconds to about 1 minute.

10. The method of claim 1 wherein the trench is a shallow trench.

11. The method of claim 10 wherein the shallow trench has a depth of up to about 0.5 microns.

12. The method of claim 1 which further comprises filling the trench with an insulating material after the rapid thermal oxidation.

13. The method of claim 12 wherein the insulating material is a silicon oxide.

14. The method of claim 12 wherein the insulating material is from TEOS.

15. The method of claim 1 wherein the rapid thermal oxidation is a wet rapid thermal oxidation process, the temperature is about 1050° C. to about 1200° C. and the liner has a thickness of about 225 to about 450 angstroms.

16. A structure comprising a trench having a liner comprising rounded corners in the top and bottom of the trench and being obtained by wet rapid thermal oxidation.

17. The method of claim 1 wherein the wet rapid thermal oxidation process is carried out in the presence of steam.

18. The method of claim 17 wherein the amount of steam is about 0.5% to about 50%.

19. The method of claim 17 wherein the amount of steam is about 2% to about 33%.

* * * * *